US010388722B2

(12) United States Patent
Falck et al.

(10) Patent No.: US 10,388,722 B2
(45) Date of Patent: Aug. 20, 2019

(54) POWER SEMICONDUCTOR DEVICE TERMINATION STRUCTURE

(71) Applicant: Infineon Technologies AG, Neubiberg (DE)

(72) Inventors: Elmar Falck, Hohenbrunn (DE); Josef-Georg Bauer, Markt Indersdorf (DE); Jens Brandenburg, Munich (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/782,041

(22) Filed: Oct. 12, 2017

(65) Prior Publication Data

US 2018/0114841 A1 Apr. 26, 2018

(30) Foreign Application Priority Data

Oct. 25, 2016 (DE) .................. 10 2016 120 301

(51) Int. Cl.
*H01L 29/06* (2006.01)
*H01L 29/40* (2006.01)
(Continued)

(52) U.S. Cl.
CPC ...... *H01L 29/0615* (2013.01); *H01L 29/0619* (2013.01); *H01L 29/0638* (2013.01);
(Continued)

(58) Field of Classification Search
CPC ... H01L 29/0615–0623; H01L 29/0638; H01L 29/7811; H01L 29/402–405;
(Continued)

(56) References Cited

U.S. PATENT DOCUMENTS 4,707,719 A * 11/1987 Whight ............... H01L 29/0619
257/489
5,113,237 A * 5/1992 Stengl ................. H01L 29/404
257/489
(Continued)

FOREIGN PATENT DOCUMENTS

CA 963174 2/1975
DE 102006056139 12/2007
(Continued)

*Primary Examiner* — Zandra V Smith
*Assistant Examiner* — Jeremy J Joy
(74) *Attorney, Agent, or Firm* — Dicke, Billig & Czaja, PLLC

(57) ABSTRACT

A power semiconductor device is disclosed. In one example, the device comprises: a semiconductor body comprising a drift region, the drift region having dopants of a first conductivity type; an active region having at least one power cell; least partially into the semiconductor body; the at least one power cell being configured to conduct a load current between said terminals and to block a blocking voltage applied between said terminals; an edge that laterally terminates the semiconductor body; and a non-active termination structure arranged in between the edge and the active region. The termination structure comprises: at least one doped semiconductor region implemented in the semiconductor body; a conductor structure, and an ohmic path that electrically couples the conductor structure with an electrical potential of the first load terminal.

20 Claims, 3 Drawing Sheets

(51) Int. Cl.
  *H01L 29/732* (2006.01)
  *H01L 29/739* (2006.01)
  *H01L 29/74* (2006.01)
  *H01L 29/78* (2006.01)
  *H01L 29/861* (2006.01)

(52) U.S. Cl.
  CPC .......... *H01L 29/404* (2013.01); *H01L 29/405* (2013.01); *H01L 29/7322* (2013.01); *H01L 29/7391* (2013.01); *H01L 29/7393* (2013.01); *H01L 29/7395* (2013.01); *H01L 29/74* (2013.01); *H01L 29/7802* (2013.01); *H01L 29/8611* (2013.01); *H01L 29/0696* (2013.01)

(58) Field of Classification Search
  CPC ............. H01L 29/7395; H01L 29/7393; H01L 29/7322; H01L 29/74
  See application file for complete search history.

(56) References Cited

U.S. PATENT DOCUMENTS

| | | | | |
|---|---|---|---|---|
| 5,486,718 A * | 1/1996 | Robb | ................ | H01L 29/0615 257/630 |
| 5,859,465 A * | 1/1999 | Spring | ................ | H01L 29/872 257/481 |
| 5,864,167 A * | 1/1999 | Cutter | ................ | H01L 29/0638 257/489 |
| 6,100,572 A * | 8/2000 | Kinzer | ................ | H01L 29/0615 257/492 |
| 6,492,689 B2 * | 12/2002 | Yamauchi | ........... | H01L 27/0629 257/359 |
| 7,772,669 B2 * | 8/2010 | Tooi | .................... | H01L 29/0619 257/490 |
| 9,401,314 B2 * | 7/2016 | Otsuki | .................... | H01L 22/14 |
| 9,496,421 B2 * | 11/2016 | Carta | .................. | H01L 23/3192 |
| 9,741,788 B2 * | 8/2017 | Takahashi | ............. | H01L 29/063 |
| 9,842,911 B2 * | 12/2017 | Tipimeni | ............. | H01L 21/266 |
| 2003/0006425 A1 * | 1/2003 | Bol | .................... | H01L 29/0619 257/127 |
| 2003/0218220 A1 * | 11/2003 | Takahashi | .......... | H01L 29/0619 257/409 |
| 2006/0003514 A1 * | 1/2006 | Richieri | ................ | H01L 29/417 438/200 |
| 2013/0214394 A1 * | 8/2013 | Senoo | .................... | H01L 29/02 257/629 |
| 2014/0061718 A1 * | 3/2014 | Song | .................... | H01L 29/402 257/139 |
| 2015/0102452 A1 * | 4/2015 | Kamibaba | ............ | H01L 29/063 257/488 |
| 2015/0340432 A1 * | 11/2015 | Siddiqui | ............. | H01L 29/0615 257/494 |

FOREIGN PATENT DOCUMENTS

| | | |
|---|---|---|
| JP | 10163482 | 6/1998 |
| JP | 2003008009 | 1/2003 |

* cited by examiner

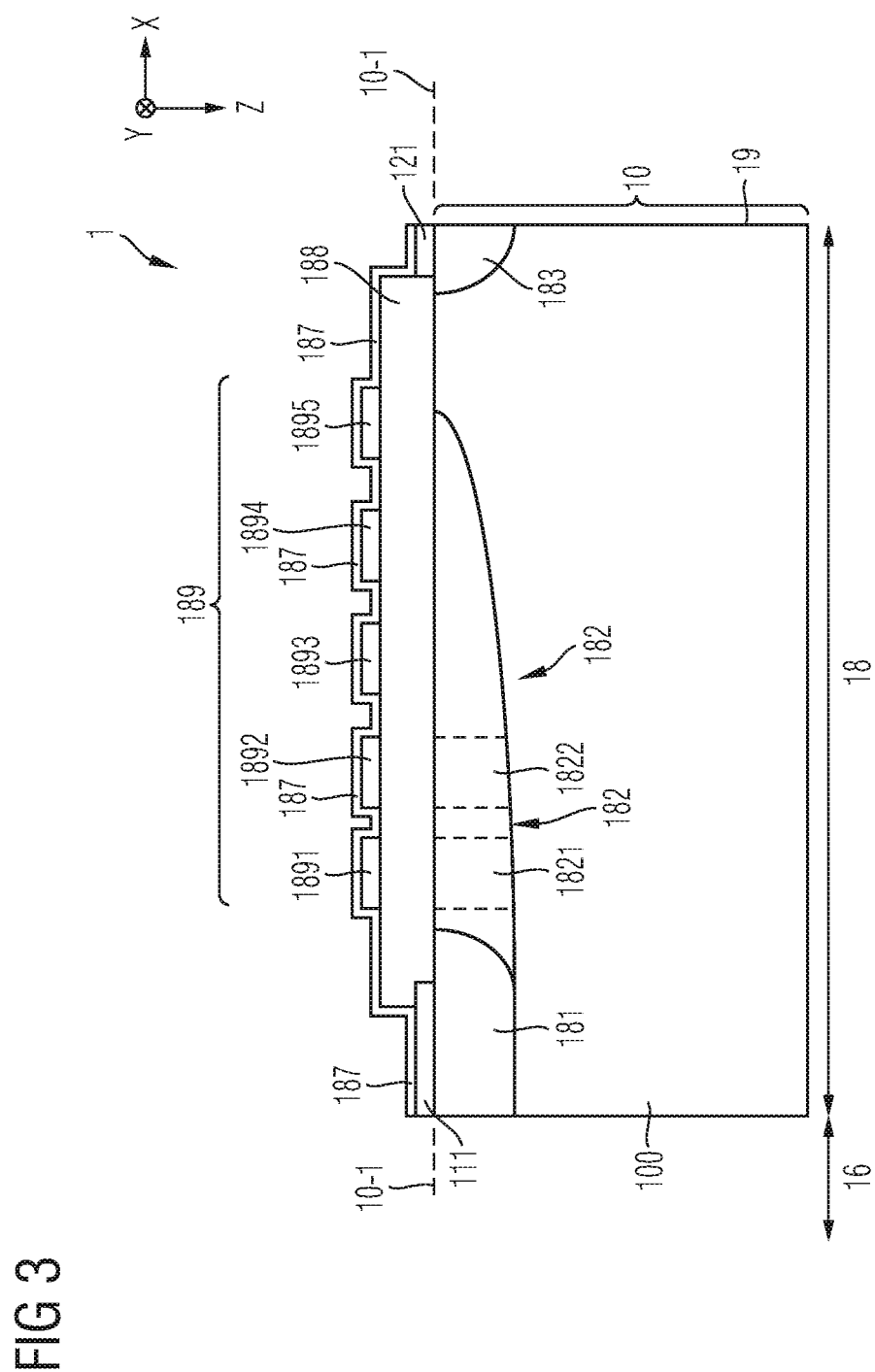

POWER SEMICONDUCTOR DEVICE TERMINATION STRUCTURE

CROSS-REFERENCE TO RELATED APPLICATION

This Utility Patent Application claims priority to German Patent Application No. 10 2016 120 301.7, filed Oct. 25, 2016, which is incorporated herein by reference.

TECHNICAL FIELD

This specification refers to embodiments of a power semiconductor device and to embodiments of processing a power semiconductor device. In particular, this specification relates to embodiments of a termination structure of a power semiconductor device and to embodiments of a method of processing of a termination structure of a power semiconductor device.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

Further, for conducting the load current, the power semiconductor device may comprise one or more power cells which may be arranged in a so-called active region of the power semiconductor device. The power semiconductor device may be laterally confined by an edge, and between the edge and the active region that comprises the one or more power cells, there may be arranged a termination structure. Such termination structure may serve the purpose of influencing the course of the electric field within the semiconductor body, e.g., so as to ensure reliable blocking capability of the power semiconductor device. The termination structure may comprise one or more components arranged within the semiconductor body, and also one or more components arranged above a surface of the power semiconductor device.

SUMMARY

According to an embodiment, a power semiconductor device comprises: a semiconductor body coupled to a first load terminal and a second load terminal of the power semiconductor device and comprising a drift region, the drift region having dopants of a first conductivity type; an active region having at least one power cell that extends at least partially into the semiconductor body and that is electrically connected with the first load terminal and that comprises a part of said drift region, the at least one power cell being configured to conduct a load current between said terminals and to block a blocking voltage applied between said terminals; an edge that laterally terminates the semiconductor body; and a non-active termination structure arranged in between the edge and the active region. The termination structure comprises: at least one doped semiconductor region implemented in the semiconductor body, wherein the at least one doped semiconductor region comprises (i) a first well with dopants of a second conductivity type, the first well being electrically connected to the first load terminal and laterally overlapping therewith and (ii) a second well having dopants of a second conductivity type, wherein a dopant concentration in the second well varies in a lateral direction; a conductor structure mounted on an insulator block that is arranged above a surface of the semiconductor body, wherein the conductor structure comprises conductors being arranged laterally adjacent to each other, wherein a first section of the second well laterally overlaps with a first of said conductors, and a second section of the second well laterally overlaps with a second of said conductors; and an ohmic path that electrically couples the conductor structure with an electrical potential of the first load terminal, the ohmic path being arranged above the surface.

According to another embodiment, a power semiconductor device comprises: a semiconductor body coupled to a first load terminal and a second load terminal of the power semiconductor device and comprising a drift region, the drift region having dopants of a first conductivity type; an active region having at least one power cell that extends at least partially into the semiconductor body and that is electrically connected with the first load terminal and that comprises a part of said drift region, the at least one power cell being configured to conduct a load current between said terminals and to block a blocking voltage applied between said terminals, wherein the at least one power cell 14 comprises a control electrode structure configured to receive a control signal from a control terminal of the power semiconductor device; an edge that laterally terminates the semiconductor body; and a non-active termination structure arranged in between the edge and the active region. The termination structure comprises: at least one doped semiconductor region implemented in the semiconductor body, wherein the at least one doped semiconductor region comprises (i) a first well with dopants of a second conductivity type, the first well being electrically connected to the first load terminal and laterally overlapping therewith and (ii) a second well having dopants of a second conductivity type, wherein a dopant concentration in the second well varies in a lateral direction; a conductor structure mounted on an insulator block that is arranged above a surface of the semiconductor body, wherein the conductor structure comprises conductors being arranged laterally adjacent to each other, wherein a first section of the second well laterally overlaps with a first of said conductors, and a second section of the second well laterally overlaps with a second of said conductors; and an ohmic path that electrically couples the conductor structure with an electrical potential of the control terminal, the ohmic path being arranged above the surface.

According to a further embodiment, a method of processing a power semiconductor device comprises: providing a semiconductor body coupled to a first load terminal and a second load terminal of the power semiconductor device and comprising a drift region, the drift region having dopants of a first conductivity type; forming an active region having at least one power cell that extends at least partially into the semiconductor body and that is electrically connected with the first load terminal and that comprises a part of said drift region, the at least one power cell being configured to conduct a load current between said terminals and to block a voltage applied between said terminals; forming an edge that laterally terminates the semiconductor body; forming a non-active termination structure arranged in between the edge and the active region. The termination structure comprises: at least one doped semiconductor region implemented in the semiconductor body, wherein the at least one doped semiconductor region comprises (i) a first well with dopants of a second conductivity type, the first well being electrically connected to the first load terminal and laterally overlapping therewith and (ii) a second well having dopants of a second conductivity type, wherein a dopant concentration in the second well varies in a lateral direction; a conductor structure mounted on an insulator block that is arranged above a surface of the semiconductor body, wherein the conductor structure comprises conductors being arranged laterally adjacent to each other, wherein a first section of the second well laterally overlaps with a first of said conductors, and a second section of the second well laterally overlaps with a second of said conductors; and an ohmic path that electrically couples the conductor structure with an electrical potential of the first load terminal, the ohmic path being arranged above the surface.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 3 schematically and exemplarily illustrates a section of a vertical cross-section of a power semiconductor device in accordance with one or more embodiments.

DETAILED DESCRIPTION

Figure 1:
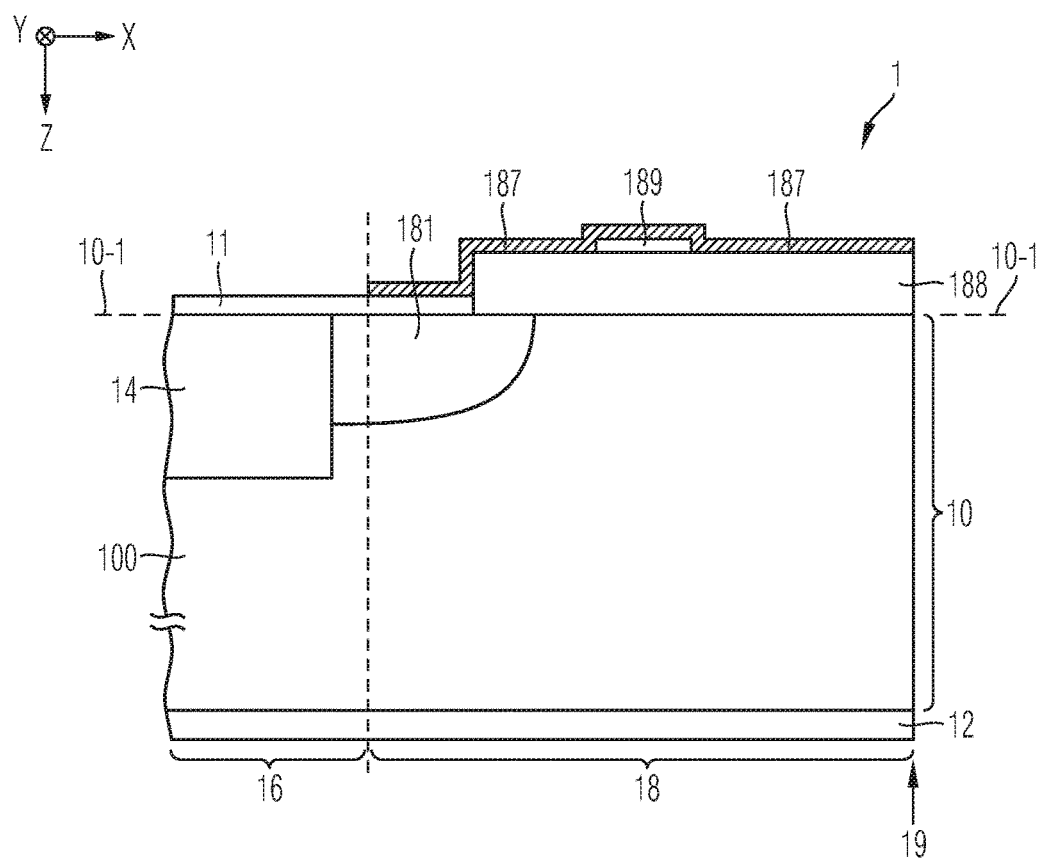
FIG. 1 schematically and exemplarily illustrates a section of a vertical cross-section of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power unit cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere or even up to some kA, and/or high voltages, typically above 100 V, more typically 500 V and above, e.g., up to at least 1 kV, up to at least more 3 kV. For example, the semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

FIG. 1 schematically and exemplarily illustrates a section of a vertical cross section of the power semiconductor device 1 in accordance with one or more embodiments. The illustrated cross-section is in parallel to plane defined by the first lateral direction X and the extension direction Z, wherein the extension direction Z may be a vertical direction. Each of the illustrated components may extend along the second lateral direction Y.

The power semiconductor device 1 comprises a semiconductor body 10 that is coupled to each of the first load terminal 11 and a second load terminal 12. The first load terminal 11 may be source terminal, e.g., arranged on a frontside of the power semiconductor device 1. The second load terminal 12 may be a collector terminal or a drain terminal, e.g., arranged on a backside of the power semiconductor device 1.

The semiconductor body 10 comprises a drift region 100 that has dopants of the first conductivity type. In an embodiment, the drift region 100 is an n⁻-doped region.

Figure 2A:
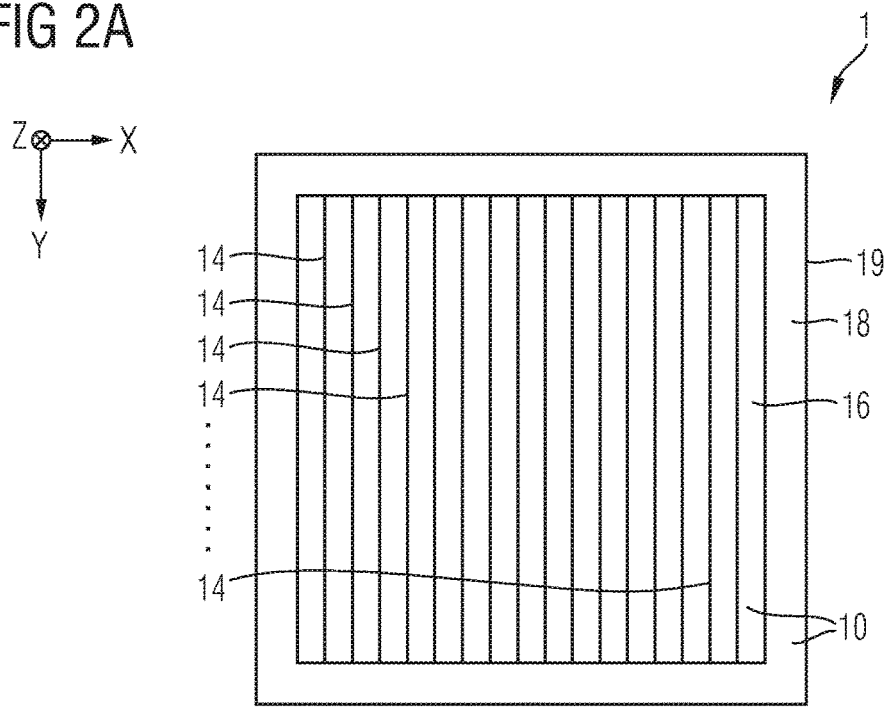
FIG. 2A-B each schematically and exemplarily illustrates a section of a horizontal projection of a power semiconductor device in accordance with one or more embodiments.
Figure 2B:
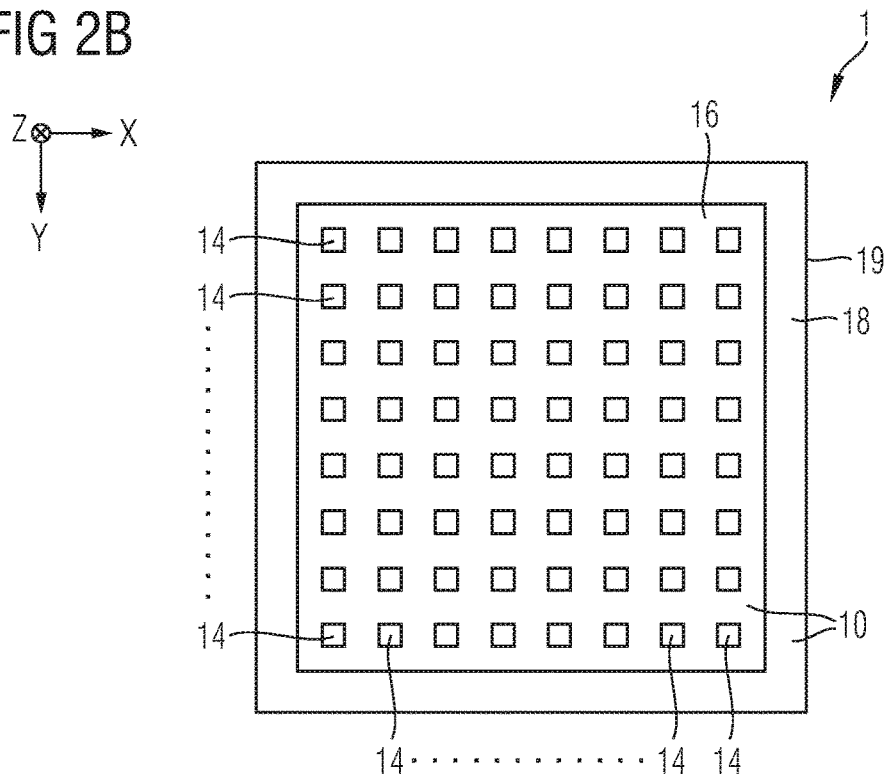

Also referring to FIGS. 2A-B, which each schematically and exemplarily illustrate a section of a horizontal projection of the power semiconductor device 1 in accordance with some embodiments, the drift region 100 may extend into each of an active region 16 and non-active termination structure 18 of the power semiconductor device 1.

For example, the active region 16 comprises one or more power cells 14 that each extent at least partially into the semiconductor body 10 and that may each be electrically connected with the first load terminal 11. Each of the one or more power cells 14 may comprise a part of said drift region 100. As illustrated in FIG. 2A, the power cells 14 may exhibit a stripe configuration, which may extend, e.g., throughout the entire active region 16 along the second lateral direction Y. In another embodiment, as illustrated in FIG. 2B, the power cells 14 may exhibit a cellular configuration, e.g., having a horizontal cross-section exhibiting one of a rectangular shape, a circular shape, and ellipsoidal shape, a rectangular shape with rounded corners.

Each of the one or more power cells 14 that may be included in the active region 16 of the power semiconductor device 1 may be configured to conduct a load current between said terminals 11 and 12, and to block a blocking voltage applied between said terminals 11 and 12.

The present specification is not limited to a specific kind of configuration of the power cells 14. Rather, the power cells 14 can exhibit any configuration that is common for a power semiconductor device, e.g., at least one of a diode configuration, a thyristor configuration, a MOS gated diode (MGD) configuration, a transistor configuration, e.g., an IGBT configuration, an RC IGBT configuration, a MOSFET configuration and a configuration derived therefrom. The skilled person is acquainted with these configurations. Accordingly, in FIG. 1, the power cell is only schematically illustrated, as the exact configuration is not a major subject of this specification.

The at least one power cell 14 can be configured for a blocking voltage of at least 300 V, of at least 500 V, of at least 1000 V, of at least 1500 V, or of at least 3000 V, or of even more than 6000 V. Further, the at least one power cell 14 may exhibit a compensation structure, which is also referred to as "superjunction" structure.

For example, in order to control the one or more power cells 14, a control terminal (not illustrated) can be provided that may be configured to forward a control signal to control electrode structure of the one or more power cells 14. For example, the control terminal can be a gate terminal. Thereby, the power semiconductor device may be set in one of the conducting state and the blocking state. In an embodiment, such control signal can be provided by means of applying a voltage between the control terminal and the first load terminal.

The semiconductor body 10 may be laterally confined, e.g., in the first lateral direction X, and the second lateral direction Y and in a direction produced by an arbitrary combination of said two lateral directions X and Y, by an edge 19. In an embodiment, the edge 19 can come into being by means of wafer dicing, to give an example.

Between the edge 19 and the active region 16, there may be arranged said termination structure 18. In an embodiment, the termination structure 18 entirely surrounds the active region 16, as schematically illustrated in FIGS. 2A-B. Further, the termination structure 18 is not configured for conducting the load current between the load terminals 11 and 12, but rather configured to ensure reliable blocking capabilities of the power semiconductor device 1, in accordance with an embodiment.

The termination structure 18 may comprise one or more components arranged above a surface 10-1 of the semiconductor body 10, as well as one or more components forming a part of the semiconductor body 10. For example, as has already been explained above, the drift region 100 extends not only into the active region 16, but also forms a part of the semiconductor body 10 that belongs to the termination structure 18, in accordance with an embodiment.

The termination structure 18 may comprise at least one doped semiconductor region 181 implemented in the semiconductor body 10. For example, this at least one doped semiconductor region 181 is different from the drift region 100. In an embodiment, the at least one doped semiconductor region 181 comprises dopants of the second conductivity type complementary to the first conductivity type. For example, the at least one doped semiconductor region 181 is a p-doped semiconductor region. Further optional aspects of the at least one doped semiconductor region of the termination structure 18 will be elucidated further below.

The termination structure 18 may include a conductor structure 189 that may be mounted on an insulator block 188, wherein the insulator block 188 can be arranged above the surface 10-1 of the semiconductor body 10. In an embodiment, the conductor structure 189 comprises at least one field plate. For example, the conductor structure 189 comprises more than one field plate, e.g., at least three field plates or at least five field plates. The conductor structure 189 may be arranged separately from the first load terminal 11.

Further, the termination structure 18 may comprise an ohmic path 187 that electrically couples the conductor structure 189 with an electrical potential of the first load terminal 11. In another embodiment, the ohmic path 187 electrically couples the conductor structure 189 with an electrical potential of the control terminal. For example, the control terminal is a gate terminal that receives a control voltage, e.g., a voltage applied between the first load terminal 11 and the control terminal, e.g., of some Volts, e.g., within the range of −15 V to +15 V, wherein the power cells 14 may be configured to be controlled based on such signal, e.g., set in one of a conducting state and a blocking state.

The following description and the drawings concern embodiments where the ohmic path 187 electrically couples the conductor structure 189 with the electrical potential of the first load terminal 11. However, it shall be understood that the present specification equally discloses, in addition to the described and illustrated embodiments, further embodiments substantially equal thereto, the difference being only that instead of the electrical potential of the first load terminal 11, the electrical potential of the control terminal is electrically coupled to the conductor structure 189 by means of the ohmic path 187.

The ohmic path 187 is arranged above the surface 10-1, e.g., the ohmic path 187 may entirely be arranged above the surface 10-1 of the semiconductor body 10. For example, the electric coupling between the conductor structure 189 and the potential of the first load terminal 11 is not established by a path that traverses a part of the semiconductor body 10.

In an embodiment, the ohmic path 187 comprises or, respectively, is realized by means of an ohmic layer that is arranged above and in contact with each of the conductor structure 189, the insulator block 188 and the first load terminal 11, as schematically illustrated in FIG. 1. For example, the ohmic path 187 does not traverse the insulator block 188.

In an embodiment, the ohmic path 187 may be electrically connected to the drift region 100, e.g., to a section of the drift region 100 that forms a part of the non-active termination structure 18, e.g., to a section of the drift region 100 adjacent to the third semiconductor region 183 that is illustrated in FIG. 3 and which may be a channel stopper. In addition or alternatively thereto, the ohmic path 187 may be electrically connected to the third semiconductor region 183, wherein the third semiconductor region 183 may be a channel stopper. Irrespectively of how the ohmic path 187 is electrically connected, it should be ensured to keep its resistivity in a reasonable range so as to keep leakage currents in the ohmic path 187 low.

Further, the ohmic path 187 may comprise or, respectively, be made of at least one of amorphous silicon, amorphous carbon and semi-insulating polycrystalline silicon (SIPOS).

In an embodiment, the ohmic path 187 that provides the electric coupling between the conductor structure 189 and the potential of the first load terminal 11 has a total ohmic resistance of at least 10 MΩ, of at least 100 MΩ, or of even more than 10 GΩ.

Further exemplary aspects of the termination structure 18 shall now be elucidated with respect to FIG. 3:

For example, the electrical potential of the first load terminal 11 is provided by a first contact 111 arranged above the surface 10-1. For example, the first contact 111 is a source bus, e.g., a source runner. The first contact 111 may be arranged, e.g., next to a gate runner (not illustrated in FIG. 3) that is configured to provide a control signal to a control electrode structure (not illustrated in FIG. 3) of the one or more power cells 14.

The first contact 111 and the conductor structure 189 may each be arranged on the frontside of the power semiconductor device 1. However, it shall be understood that the first contact 111 can be different from each of the conductor structure 189 and the first load terminal 11.

Laterally overlapping with the first contact 111 that provides the electrical potential of the first load terminal 11, there may be arranged a first well 181 comprising, e.g., dopants of the second conductivity type. For example, the first well is a p-doped well 181.

Adjacent to the first contact 111, there may be arranged the insulator block 188. Further proceeding towards the edge 19 of the power semiconductor device 1, there can be arranged a second contact 121 that is configured to provide the electrical potential of the second load terminal 12, which can be, e.g., a collector terminal or drain terminal. In an embodiment, said two contacts 111 and 121 are separated from each other by means of at least the insulator block 188. For example, the insulator block 188 may comprise a passivation layer.

On top of the insulator block 188, there is arranged the conductor structure 189. In an embodiment, the conductor structure 189 comprises a number of separate conductors being arranged laterally adjacent to each other. In the example illustrated in FIG. 3, they are five separate of such conductors 1891, 1892, 1893, 1894, 1895. However, it shall be understood that, in accordance with other embodiments, there can be provided more than five separate conductors or less than five conductors. In an embodiment, each of these separate conductors 1891 to 1895 forms a field plate. Further, each of the separate conductors 1891 to 1895 may entirely surround the active region 16.

As illustrated in FIG. 3, the ohmic path 187 may be provided as an ohmic layer that covers each of the separate conductors 1891 to 1895 of the conductor structure 189, the insulator block 188 and the first contact 111 that provides the electric potential of the first load terminal 11. As has been explained above, the ohmic path 187, e.g., implemented as said ohmic layer, may further be electrically connected with the third semiconductor region 183, which may be a channel stopper.

In another embodiment, which is not illustrated, the conductor structure 189 is arranged above the ohmic layer realizing the ohmic path 187. For example, the ohmic layer is deposited first and then, after depositing the ohmic layer, the conductor structure 189 is formed on top thereof.

Further, the ohmic path 187 may additionally extend towards the edge 19 of the power semiconductor device 1 so as to also cover the second contact 121 that provides the electric potential of the second load terminal 12, in accordance with an embodiment. For example, the total ohmic resistance of the ohmic path 187 between the first contact 111 and the second contact 121 is greater than 1 kΩ, greater than 10 kΩ, greater than 100 kΩ, or even greater than 1 MΩ. As indicated above, the total ohmic resistance can be chosen such that a leakage current in the ohmic path 187 is kept under a certain value. For example, said total ohmic resistance can be chosen in dependence of the blocking voltage. In another embodiment, as also explained above, the ohmic path 187 may be electrically insulated from the third semiconductor region 183. To this end, the ohmic path 187 may terminate on top of the insulator block 188 and may not contact the second contact 121, for example. Or, instead of the second contact 121, an insulator may be provided at the same position instead.

In an embodiment, the at least one doped semiconductor region of the termination structure 18 comprises a second well 182. For example, the second well 182 exhibits a junction termination extension (JTE) configuration, e.g., a variation of the lateral dopant concentration (VLD) configuration. For example, the dopant concentration of the second well 182 varies in the lateral direction, e.g., the dopant concentration may decrease, e.g., continuously and/or in a step-like manner, along the first lateral direction X.

In an embodiment, the dopant concentration of the second well 182 is lower as compared to the dopant concentration of the first well 181.

Accordingly, at this point, it shall be understood that in an embodiment, the termination structure 18 of the power semiconductor device 1 may comprise each of the number of field plates 1891 to 1895 arranged above the surface 10-1 and constituting the conductor structure 189, as well as at least one doped semiconductor region 182 that is arranged below the surface 10-1 and that exhibits a VLD configuration. Further, in this embodiment, each of the one or more field plates 1891-1895 can be elevated with respect to the first contact 111, said elevation being provided by the insulator block 188. Further, in this embodiment, each of the field plates 1891-1895 can be interconnected with each other by means of the ohmic path 187, said ohmic path 187 being formed by an ohmic layer arranged entirely above the surface 10-1 and in contact with each of the first contact 111 and each of the field plates 1891-1895, and if present, optionally also in contact with the second contact 121. In addition, in this embodiment, said at least one doped semiconductor region 182 can laterally overlap with the conductor structure 189. For example, a first section 1821 of the second well 182 laterally overlaps with a first of said conductors 1891 (field plate), and a second section 1822 of the second well 182 may laterally overlap with a second of said conductors 1892 (field plate), wherein the average dopant concentrations present in the first section 1821 and the second section 1822 may be identical to each other or, in another embodiment, the dopant concentration present in the second section 1822 is reduced by a factor of at least two as compared to the dopant concentration present in the first section 1821.

The conductor structure 189, e.g., each of its one or more field plates 1891-1895, can be configured to reduce and/or stabilize an electric field in a section of the semiconductor body 10 arranged in the termination structure 18. For example, this may occur by reducing the influence of external charges which may be present above the ohmic path 187, for example present in polyimide layer (not illustrated) or in a passivation gel.

The ohmic path 187, e.g., realized by means of an ohmic layer, can be configured to avoid an undesired charging and/or an undesired discharging of the conductive structure 189. Further, the total ohmic resistance of the ohmic path 187 can be chosen such that, on the one side, an appropriate coupling between the conductor structure 189 and the electrical potential of the first load terminal 11 is ensured, and that, on the other side, a leakage current is simultaneously kept low, e.g., during a blocking state of the power semiconductor device 1, e.g., in the event where the ohmic path 187 also covers, e.g., contacts the second contact 121 mentioned above.

In a further embodiment, in addition to the ohmic path 187 being realized by an ohmic layer, at least one of the field plates of the conductor structure 189 may be electrically connected with the second well 182 exhibiting the VLD configuration, such that the respective field plate of the conductive structure 189 exhibits substantially the same electrical potential as the second well that is being contacted.

In a yet further embodiment, the at least one doped semiconductor region of the termination structure 18 may comprise a third well 183, which may be arranged at an outermost region of the termination structure 18, e.g., in proximity to the edge 19. For example, the third well 183 is electrically connected to the electrical potential of the second load terminal 12, e.g., by means of the second contact 121, as illustrated in FIG. 3. The third well 183 may be configured to act as a channel stopper. For example, the third well 183 comprises dopants of the second conductivity type. In another embodiment, the third well 183 comprises dopants of the first conductivity type. The at least one doped semiconductor region of the termination structure 18 may further comprises at least one guard ring (not illustrated).

In an embodiment, the at least one semiconductor region of the termination structure 18 comprises each of the first well 181, the second well 182 and the third well 183, wherein each of these wells may exhibit a common extension range in the extension direction Z of at least 0.5 μm. For example, each of these wells may extend from the surface 10-1 along the extension direction Z for at least 0.5 μm.

In accordance with a further embodiment, a method of processing a power semiconductor device is presented, e.g., a method for forming a power semiconductor device 1 in accordance with one of the above described embodiments. For example, the method may comprise the following steps: providing a semiconductor body 10 coupled to a first load terminal 11 and a second load terminal 12 of the power semiconductor device 1 and comprising a drift region 100, the drift region 100 having dopants of a first conductivity type; forming an active region 16 having at least one power cell 14 that extends at least partially into the semiconductor body 10 and that is electrically connected with the first load terminal 11 and that comprises a part of said drift region 100, the at least one power cell 14 being configured to conduct a load current between said terminals 11, 12 and to block a voltage applied between said terminals 11, 12; forming an edge 19 that laterally terminates the semiconductor body 10; forming a non-active termination structure 18 arranged in between the edge 19 and the active region 16. The termination structure 18 can comprise: at least one doped semiconductor region 181, 182, 183 implemented in the semiconductor body 10; a conductor structure 189 mounted on an insulator block 188 that is arranged above a surface 10-1 of the semiconductor body 10; and an ohmic path 187 that electrically couples the conductor structure 189 with an electrical potential of the first load terminal 11, the ohmic path 187 being arranged above the surface 10-1.

Regarding further embodiments of the method of processing a power semiconductor device presented above, it is referred to the embodiments of the power semiconductor device that has been described above first respect to FIGS. 1 to 3. For example, when processing the termination structure 18, the ohmic path 187 may be provided by means of depositing at least one of amorphous silicon, amorphous carbon and SIPOS so as to create an ohmic layer that covers each of the conductor structure 189 and the first contact 111 that provides electrical potential of the first load terminal 11.

Further, the ohmic path 187 may be implemented as a homogenous layer, e.g., by depositing said material homogenously within the termination structure 18. In another embodiment, the ohmic path 187 is implemented by means of a laterally structured layer, e.g., a layer that is laterally structured along the first lateral direction X and/or the second lateral direction Y. Such lateral structure may allow for reducing the ohmic resistance and, thus, for reducing the leakage current in the ohmic path 187. For example, the ohmic path 187 is implemented as a laterally structured layer that may comprise a number of stripes that extend in a radial direction from a center to the edge 19, e.g., in FIGS. 1 and 3 in the first lateral direction X. The stripes may be arranged spatially separated from each other, e.g., with a distance within the range of 10 nm-50 µm. Other arbitrary geometries of a lateral structure of the ohmic layer that forms the ohmic path 187 are possible.

In another embodiment of the method, the ohmic layer is produced before forming the conductive structure 189. Thus, as has been excluded above, the conductive structure 189 may also be arranged on top of the ohmic layer that realizes the ohmic paths 187.

In a further embodiment of the method, the second well 182 mentioned above that may exhibit the VLD configuration may be produced by forming a plurality of p-doped rings in the section of the semiconductor body 10 belonging to the termination structure 18, the p-doped being arranged laterally adjacent to each other, and by subsequently carrying out a diffusion processing step such that the previously separate p-rings merge to the contiguous second well 182. In an embodiment, a lateral width of a respective field plate 1891-1895 is equal or smaller than a diffusion width of a respective one of the formed p-rings.

In an embodiment, the termination structure 18 is configured to ensure for reliable blocking capability of the power semiconductor device 1.

In the above, embodiments pertaining to semiconductor device processing methods were explained. For example, these semiconductor devices are based on silicon (Si). Accordingly, a monocrystalline semiconductor region or layer, e.g., the semiconductor body 10, the drift region 100, the regions 181, 182 and 183 of exemplary embodiments, can be a monocrystalline Si-region or Si-layer. In other embodiments, polycrystalline or amorphous silicon may be employed.

It should, however, be understood that the semiconductor body 10 and components, e.g., regions 100, 181 to 183 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor device, comprising:
a semiconductor body coupled to a first load terminal and a second load terminal of the power semiconductor device and comprising a drift region, the drift region having dopants of a first conductivity type;
an active region having at least one power cell that extends at least partially into the semiconductor body and that is electrically connected with the first load terminal and that comprises a part of said drift region, the at least one power cell being configured to conduct a load current between said terminals and to block a blocking voltage applied between said terminals;
an edge that laterally terminates the semiconductor body;

a non-active termination structure arranged in between the edge and the active region, the termination structure comprising:
  at least one doped semiconductor region implemented in the semiconductor body, wherein the at least one doped semiconductor region comprises a first well with dopants of a second conductivity type, the first well being electrically connected to the first load terminal and laterally overlapping therewith and a second well having dopants of a second conductivity type, wherein a dopant concentration in the second well decreases in a lateral direction from the first well towards the edge;
  a conductor structure mounted on an insulator block that is arranged above a surface of the semiconductor body, wherein the conductor structure comprises conductors being arranged laterally adjacent to each other, wherein a first section of the second well laterally overlaps with a first of said conductors, wherein a second section of the second well laterally overlaps with a second of said conductors, and wherein an average dopant concentration present in the second section is less than the average dopant concentration present in the first section by at least a factor of two; and
  an ohmic path that electrically couples the conductor structure with an electrical potential of the first load terminal, the ohmic path being arranged above the surface.

2. The power semiconductor device of claim 1, wherein the ohmic path comprises an ohmic layer that is arranged above and in contact with each of the conductor structure, the insulator block and the first load terminal.

3. The power semiconductor device of claim 1, wherein the ohmic layer is laterally structured.

4. The power semiconductor device of claim 1, wherein the ohmic path comprises at least one of amorphous silicon, amorphous carbon and semi-insulating polycrystalline silicon.

5. The power semiconductor device of claim 1, wherein the ohmic path that electrically couples the conductor structure with the electrical potential of the first load terminal has a total ohmic resistance of at least 1 kΩ.

6. The power semiconductor device of claim 1, wherein the ohmic path does not traverse the insulator block.

7. The power semiconductor device of claim 1, wherein the conductor structure laterally overlaps with the at least one doped semiconductor region.

8. The power semiconductor device of claim 1, comprising a first contact configured to provide the electrical potential of the first load terminal, wherein the first contact and the conductor structure are arranged on a frontside of the power semiconductor device.

9. The power semiconductor device of claim 8, wherein the at least one doped semiconductor region exhibits a VLD configuration, and wherein the conductors form one or more field plates, the field plates being arranged so as to laterally overlap with the at least one doped semiconductor region exhibiting the VLD configuration.

10. The power semiconductor device of claim 9, wherein the one or more field plates are elevated with respect to the first contact, said elevation being provided by the insulator block.

11. The power semiconductor device of claim 9, wherein the one or more field plates are interconnected with each other by means of the ohmic path, said ohmic path being formed by an ohmic layer arranged in contact with each of the first contact and each of the one or more field plates.

12. The power semiconductor device of claim 1, wherein the conductor structure is configured to reduce and/or to stabilize an electric field in a section of the semiconductor body arranged in the termination structure.

13. The power semiconductor device of claim 1, wherein the insulator block comprises a passivation layer arranged between the conductor structure and the at least one doped semiconductor region.

14. The power semiconductor device of claim 1, wherein the second well is electrically connected with the first load terminal.

15. The power semiconductor device of claim 1, wherein the first well and the second well each extend into the semiconductor body along an extension direction and exhibit a common lateral extension range along the extension direction of at least 0.5 um.

16. The power semiconductor device of claim 1, wherein the drift region extends into each of the active region and the termination structure.

17. The power semiconductor device of claim 1, wherein the conductor structure is entirely arranged above the insulator block.

18. The power semiconductor device of claim 1, wherein the ohmic path is entirely arranged above the surface of the semiconductor body.

19. A power semiconductor device, comprising:
  a semiconductor body coupled to a first load terminal and a second load terminal of the power semiconductor device and comprising a drift region, the drift region having dopants of a first conductivity type;
  an active region having at least one power cell that extends at least partially into the semiconductor body and that is electrically connected with the first load terminal and that comprises a part of said drift region, the at least one power cell being configured to conduct a load current between said terminals and to block a blocking voltage applied between said terminals, wherein the at least one power cell comprises a control electrode structure configured to receive a control signal from a control terminal of the power semiconductor device;
  an edge that laterally terminates the semiconductor body;
  a non-active termination structure arranged in between the edge and the active region, the termination structure comprising:
    at least one doped semiconductor region implemented in the semiconductor body, wherein the at least one doped semiconductor region comprises a first well with dopants of a second conductivity type, the first well being electrically connected to the first load terminal and laterally overlapping therewith and a second well having dopants of a second conductivity type, wherein a dopant concentration in the second well decreases in a lateral direction from the first well towards the edge;
    a conductor structure mounted on an insulator block that is arranged above a surface of the semiconductor body, wherein the conductor structure comprises conductors being arranged laterally adjacent to each other, wherein a first section of the second well laterally overlaps with a first of said conductors, wherein a second section of the second well laterally overlaps with a second of said conductors, and wherein an average dopant concentration present in the second section is less than the average dopant concentration present in the first section by at least a factor of two; and an ohmic path that electrically couples the conductor structure with an electrical potential of the control terminal, the ohmic path being arranged above the surface.

20. A method of processing a power semiconductor device, comprising:

providing a semiconductor body coupled to a first load terminal and a second load terminal of the power semiconductor device and comprising a drift region, the drift region having dopants of a first conductivity type;

forming an active region having at least one power cell that extends at least partially into the semiconductor body and that is electrically connected with the first load terminal and that comprises a part of said drift region, the at least one power cell being configured to conduct a load current between said terminals and to block a voltage applied between said terminals;

forming an edge that laterally terminates the semiconductor body;

forming a non-active termination structure arranged in between the edge and the active region, the termination structure comprising:

at least one doped semiconductor region implemented in the semiconductor body, wherein the at least one doped semiconductor region comprises a first well with dopants of a second conductivity type, the first well being electrically connected to the first load terminal and laterally overlapping therewith and a second well having dopants of a second conductivity type, wherein a dopant concentration in the second well decreases in a lateral direction from the first well towards the edge;

a conductor structure mounted on an insulator block that is arranged above a surface of the semiconductor body, wherein the conductor structure comprises conductors being arranged laterally adjacent to each other, wherein a first section of the second well laterally overlaps with a first of said conductors, wherein a second section of the second well laterally overlaps with a second of said conductors, and wherein an average dopant concentration present in the second section is less than the average dopant concentration present in the first section by at least a factor of two; and an ohmic path that electrically couples the conductor structure with an electrical potential of the first load terminal, the ohmic path being arranged above the surface.

* * * * *